United States Patent
Ishida et al.

(10) Patent No.: US 6,277,698 B1
(45) Date of Patent: Aug. 21, 2001

(54) METHOD OF MANUFACTURING SEMICONDUCTOR DEVICES HAVING UNIFORM, FULLY DOPED GATE ELECTRODES

(75) Inventors: Emi Ishida, Sunnyvale; Dong-Hyuk Ju, Cupertino; David Wu, San Jose, all of CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/382,580

(22) Filed: Aug. 25, 1999

(51) Int. Cl.$^7$ ................................................ H01L 21/336
(52) U.S. Cl. ............................................. 438/299; 438/301
(58) Field of Search .................................. 438/626, 239, 438/253, 254, 381, 396, 397, 230, 299, 301, 162, 585, 592, 659, 180, 229

(56) References Cited

U.S. PATENT DOCUMENTS 5,840,604 * 11/1998 Yoo et al. .............................. 438/230
5,879,975 * 3/1999 Karlsson et al. ...................... 438/162

* cited by examiner

Primary Examiner—Matthew Smith
Assistant Examiner—Calvin Lee (57) ABSTRACT

A semiconductor device is provided with a gate electrode having a substantially rectangular profile by forming a dielectric film prior to depositing the gate electrode layer. The dielectric film is patterned and etched to form regions having a rectangular profile separated by open regions. A gate electrode layer is then deposited followed by planarization to form gate electrodes having a substantially rectangular profile.

20 Claims, 7 Drawing Sheets

METHOD OF MANUFACTURING SEMICONDUCTOR DEVICES HAVING UNIFORM, FULLY DOPED GATE ELECTRODES

TECHNICAL FIELD

The present invention relates to a method of manufacturing high density semiconductor devices having fully doped gate electrodes. The present invention is particularly applicable in manufacturing high density CMOS semiconductor devices having a design rule of about 0.18 microns and under.

BACKGROUND ART

The escalating requirements for high density and performance associated with ultra large scale integration semiconductor devices require design features of 0.25 microns and under, increased transistor and circuit speeds, high reliability and increased manufacturing throughput. The reduction of design features to 0.25 microns and under challenges the limitations of conventional semiconductor methodology.

Figure 1:
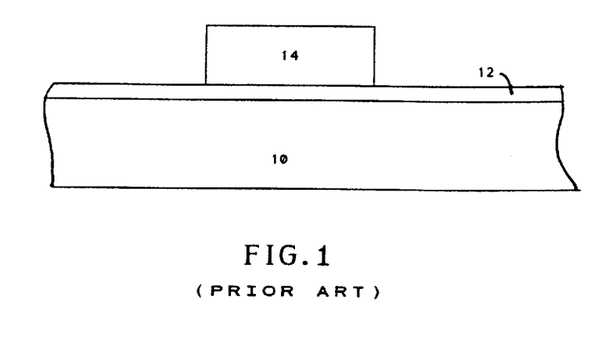
FIG. 1 illustrates the formation of a dielectric layer and gate electrode according to conventional methodology.

In conventional semiconductor methodology illustrated in FIG. 1, an initial gate dielectric layer 12, such as silicon oxide, is formed on semiconductor substrate 10 and a gate electrode layer formed thereon as in conventional practices. The gate electrode layer, typically polycrystalline silicon, is etched in a conventional manner to form gate electrode 14 on underlying gate oxide layer 12.

Figure 2:
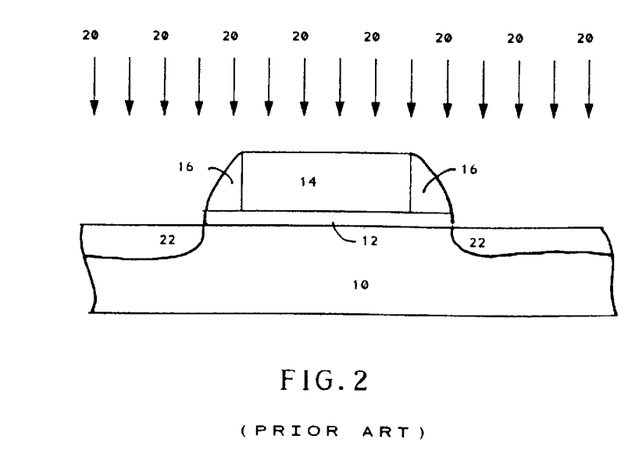
FIG. 2 illustrates the formation of sidewall spacers and source/drain implants according to conventional methodology.

Next, an insulating layer is deposited and etched to form sidewall spacers 16 on the side surfaces of gate electrode 14 and underlying dielectric layer 12 adjacent gate electrode 14 side surfaces, as shown in FIG. 2. In forming sidewall spacers 16, gate oxide layer 12 is etched, thereby exposing the surface of semiconductor substrate 10 adjacent sidewall spacers 16. Subsequently, using gate electrode 14 and sidewall spacers 16 as a mask, impurities are ion implanted, as indicated by arrows 20 in FIG. 2. The ion implantation functions to form source/drain implants 22 and to dope gate electrode 14.

As device features continually shrink in size, it becomes necessary to decrease the depth of source/drain regions in the semiconductor substrate, i.e., the junction depth. For example, in forming a polycrystalline silicon gate electrode having a width of about 0.25 microns, the junction depth ($X_j$) should be no greater than about 800 Å e.g., less than 500 Å. This objective is extremely difficult to achieve, particularly when implanting impurities to dope the gate electrode and form source/drain regions.

For example, a drawback attendant upon employing a single ion implantation step to form source/drain implants 22 and to dope gate electrode 14 is that impurities implanted to form shallow source/drain implants 22 are implanted at a relatively low energy, e.g., about 0.2 KeV to about 50 KeV. The implanted impurities achieve desirably shallow penetration depth into substrate 10 at the expense of shallow penetration into gate electrode 14. This causes gate depletion, i.e., lack of carriers at gate electrode 14/gate oxide 12 interface, resulting in decreased capacitance and reduced drive current.

Additionally, as device features continually shrink in size, various circuit structures/parameters become increasingly important. For example, the profile of gate electrode 14 after etching must be substantially rectangular, i.e., the side surfaces being substantially parallel to each other and substantially perpendicular to the upper surface of semiconductor substrate 10, to ensure optimum transistor performance and reliability. Conventional semiconductor methodology comprises depositing a layer of polycrystalline silicon followed by etching to form gate electrode 14. However, due to the large grain size of polycrystalline silicon, it is difficult to form a polysilicon gate electrode with a substantially rectangular profile.

Subsequently, ion implantation is conducted to form source/drain regions of a transistor having a targeted channel length. However, since the profile of gate electrode 14 is often non-rectangular and non-uniform, the channel length of the transistor is difficult to control. For example, variations in the gate electrode profile adversely affect the targeted channel length of the transistor, thereby affecting transistor performance. Certain non-uniformities in the profile can also cause performance degradation, e.g., transistor drive current non-uniformities and asymmetry.

SUMMARY OF THE INVENTION

There exists a need for a method of manufacturing a semiconductor device having fully doped gate electrodes.

There is also a need for a method of manufacturing a semiconductor device having a substantially rectangular gate electrode profile.

Additional advantages and other features of the invention will be set forth in part in the description which follows and in part will become apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a method of manufacturing a semiconductor device. The method includes forming a first dielectric layer on an upper surface of a semiconductor substrate and forming a film on the first dielectric layer. The method also includes patterning and etching the film to form regions having a rectangular profile on the first dielectric layer separated by open regions and depositing a conductive layer on the semiconductor substrate. The method further includes planarizing the conductive layer to form a gate electrode having an upper surface and side surfaces, wherein the side surfaces are substantially parallel to each other and substantially perpendicular to the upper surface of the semiconductor substrate.

Another aspect of the present invention is a method of manufacturing a CMOS semiconductor device comprising an N-channel transistor region and a P-channel transistor region. The method includes forming a first dielectric layer on an upper surface of a semiconductor substrate and forming a film on the first dielectric layer. The method also includes patterning and etching the film to form regions having a rectangular profile on the first dielectric layer separated by open regions and depositing a conductive layer on the semiconductor substrate. The method further includes planarizing the conductive layer to form a first gate electrode of an N-channel transistor and a second gate electrode of a P-channel transistor with each gate electrode having an upper surface and side surfaces, wherein the side surfaces are substantially parallel to each other and substantially perpendicular to the upper surface of the semiconductor substrate.

Other advantages of the present invention will become readily apparent to those skilled in this art from the following detailed description. The embodiments shown and described provide illustration of the best mode contemplated for carrying out the present invention. The invention is capable of modifications in various obvious respects, all without departing from the present invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like element throughout.

DESCRIPTION OF THE INVENTION

The present invention addresses and solves problems associated with forming transistors having shallow junction depths, thereby enabling the formation of transistors with very shallow source/drain junctions, while preventing gate electrode depletion. The present invention also addresses and solves problems associated with forming substantially rectangular gate electrodes from polysilicon, thereby enabling the formation of transistors with uniform gate electrodes and consistent channel lengths.

The present invention solves such problems associated with gate electrodes exhibiting gate depletion and non-uniform gate electrodes by forming a film prior to depositing a gate electrode layer. The inventive methodology includes patterning the film to provide uniform areas for polysilicon deposition. The inventive methodology also includes selectively masking and implanting impurities to dope the polysilicon, prior to forming source/drain regions. Subsequently, the film is removed and the resulting gate electrodes are fully doped, uniformly-sized and rectangular in shape.

Figure 3:
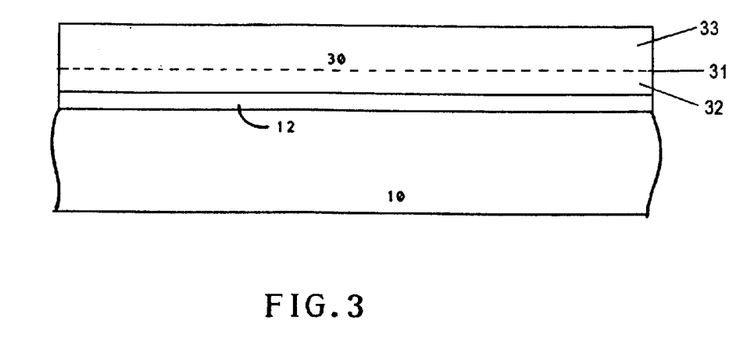
FIG. 3 illustrates the formation of a dielectric film on a semiconductor substrate according to an embodiment of the present invention.

In accordance with an embodiment of the present invention illustrated in FIG. 3, an initial gate dielectric layer 12, such as silicon oxide, is formed on semiconductor substrate 10, typically comprising doped monocrystalline silicon. The present invention departs from conventional methodology by forming a dielectric film 30, e.g., by chemical vapor deposition (CVD), at a targeted thickness, based on the particular circuit requirements. For example, it has been found suitable to form film 30 having a thickness of about 1000 Å to about 3500 Å.

Film 30 functions to facilitate the formation of uniformly-sized, rectangular gate electrodes and can consist of a composite stacked structure including multiple individual films separated by dashed line 31. For example, film 30 can consist of a nitride layer 32 deposited on gate oxide 12 with an oxide layer 33 deposited on the nitride layer. Alternatively, other materials and combinations of materials can be used to form film 30, e.g., a single nitride layer, based on the particular design requirements. However, film 30 would typically not consist of a single layer of silicon oxide when gate oxide 12 is also silicon oxide, as subsequent etching to remove film 30 could result in the removal of gate oxide 12.

Figure 4:
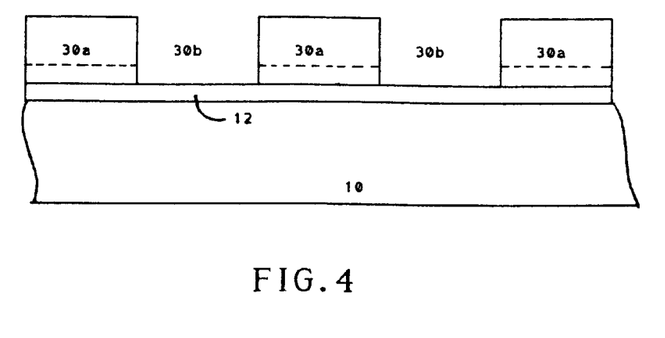
FIG. 4 illustrates the patterning and etching of the film of FIG. 3 according to an embodiment of the present invention.

Adverting to FIG. 4, film 30 is then patterned and etched in a conventional manner to form rectangular regions 30a separated by open regions 30b. Advantageously, film 30 is more easily patterned and etched than gate oxide 12 and polycrystalline silicon, resulting in regions 30b having substantially rectangular profiles.

Figure 5:
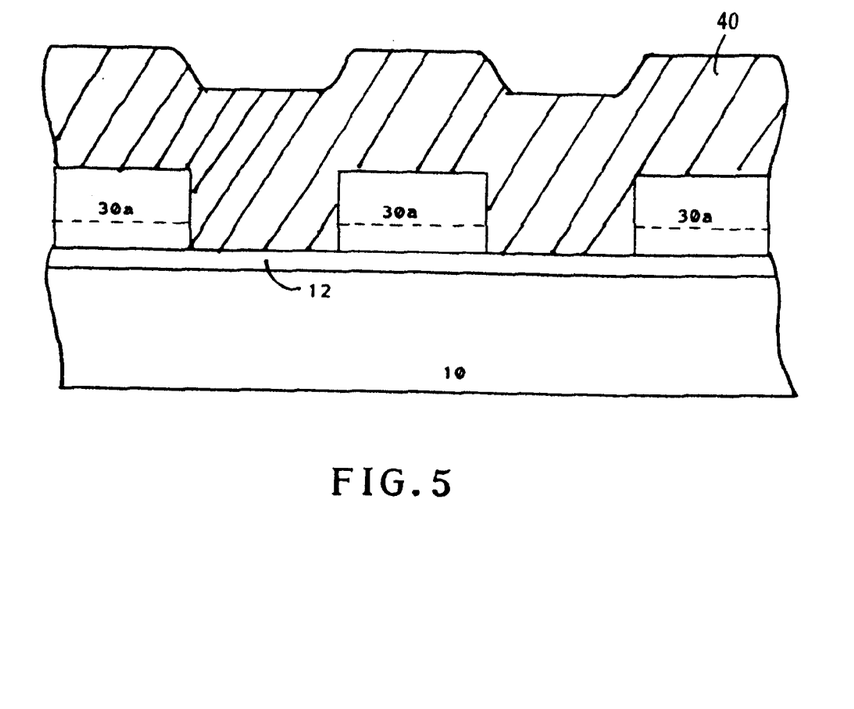
FIG. 5 illustrates the formation of a polysilicon layer on the device of FIG. 4 according to an embodiment of the present invention.

A layer of polycrystalline silicon 40 is then deposited, e.g., by CVD, on semiconductor substrate 10, as shown in FIG. 5. The thickness of polysilicon layer 40 is based on the particular design requirements for subsequently formed gate electrodes. For example, it has been found suitable to form polycrystalline silicon layer 40 having a thickness of about 1000 Å to about 5000 Å.

Figure 6:
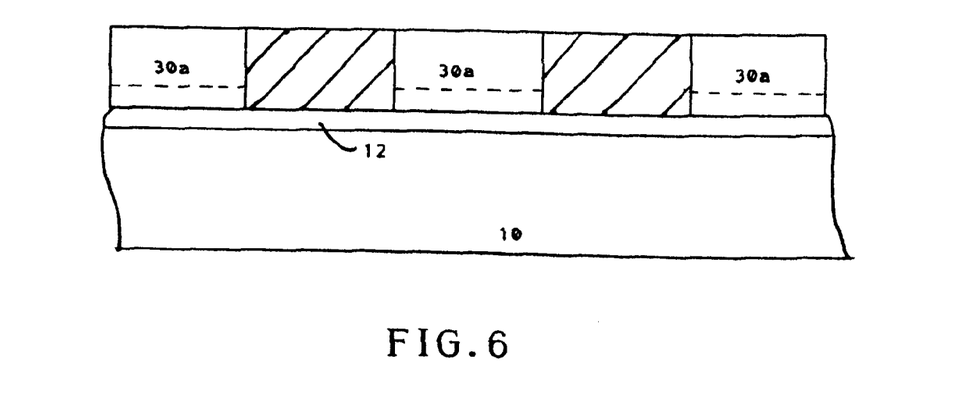
FIG. 6 illustrates a chemical-mechanical polish for the device of FIG. 5 according to an embodiment of the present invention.

A chemical-mechanical polish (CMP) is then performed to remove excess polysilicon and provide a smooth surface, as shown in FIG. 6, for subsequently formed gate electrodes. The present invention further departs from conventional methodology by de-coupling gate electrode doping from source/drain implantation.

Figure 7:
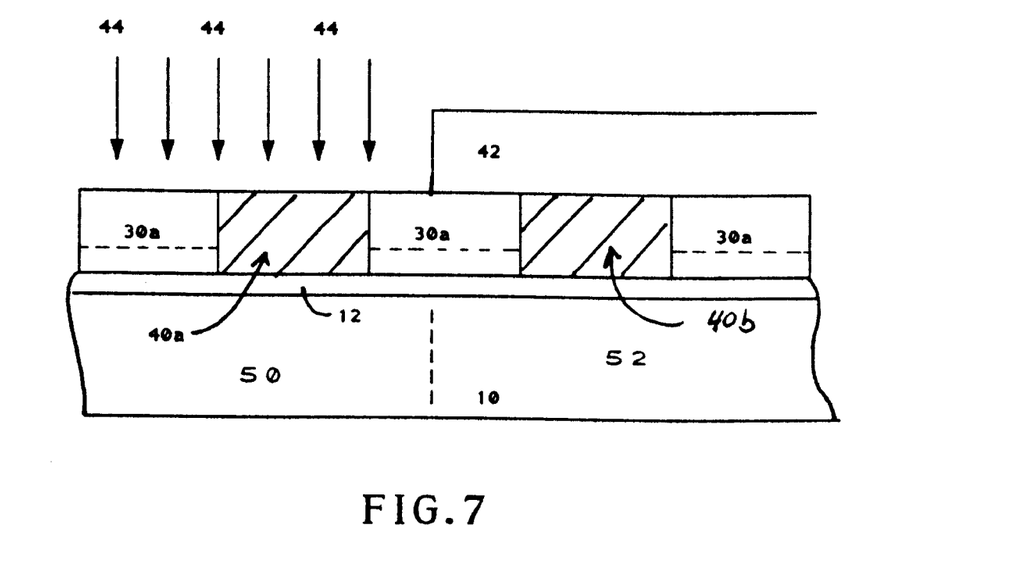
FIG. 7 illustrates the doping of an N-channel gate electrode according to an embodiment of the present invention.

Adverting to FIG. 7, the semiconductor is divided into N-channel region 50 and P-channel region 52, shown separated by a dashed line in semiconductor substrate 10. A mask 42 is then formed over P-channel region 52, e.g. by a photoresist material, and N-type impurities are ion implanted, as indicated by arrows 44, to dope polysilicon region 40a.

For example N-type impurities, such as arsenic or phosphorous, can be implanted at a dosage of about $1 \times 10^{14}$ atoms/cm$^2$ to about $1 \times 10^{16}$ atoms/cm$^2$ and an implantation energy of about 5 KeV to about 70 KeV to dope polysilicon region 40a. Alternatively, other N-type impurities, such as antimony, can also be implanted at various dosages and implantation energies based on the particular design requirements.

Next, mask 42 over P-channel region 52 is removed and the semiconductor is annealed to activate the implanted impurities. Activation annealing is typically conducted at a temperature of about 900° C. to about 1075° C. for a period up to about 60 seconds to activate the implanted impurities.

Figure 8:
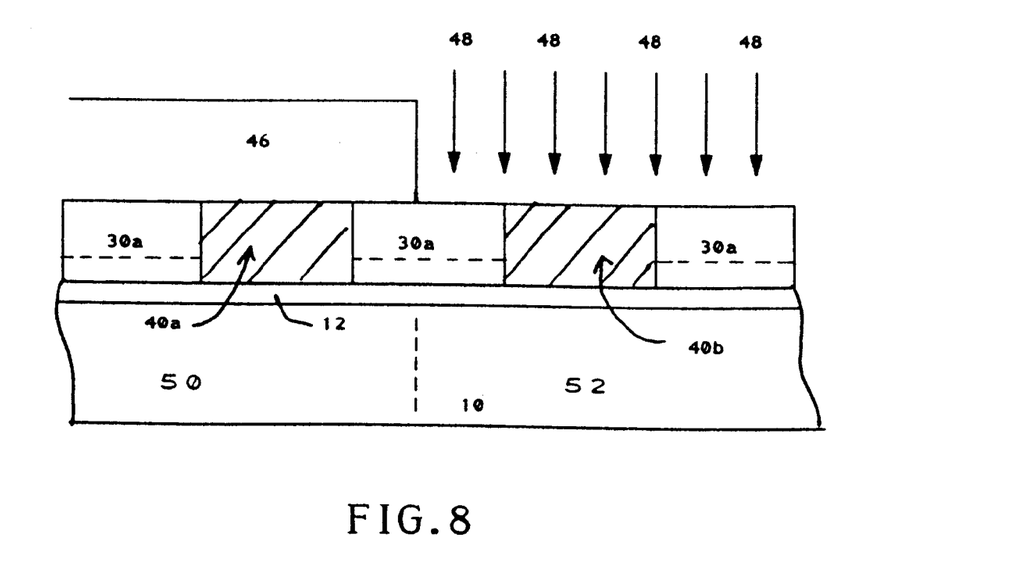
FIG. 8 illustrates the doping of a P-channel gate electrode according to an embodiment of the present invention.

Next, a mask 46 is formed over N-channel region 50, e.g. by a photoresist material, as shown in FIG. 8. Subsequently, P-type impurities are ion implanted, as indicated by arrows 48, to dope polysilicon region 40b. For example P-type impurities, such as boron or $BF_2$ can be implanted at a dosage of about $1\times10^{14}$ atoms/cm$^2$ to about $1\times10^{16}$ atoms/cm$^2$ and an implantation energy of about 0.2 KeV to about 60 KeV to dope polysilicon region 40b. Alternatively, other P-type impurities can also be implanted at various dosages and implantation energies based on the particular design requirements.

Next, mask 46 over N-channel region 50 is removed and the semiconductor is annealed to activate the implanted impurities. Annealing is typically conducted at a temperature of about 900° C. to about 1075° C. for up to about 60 seconds to activate the implanted impurities.

Advantageously, implanting and annealing the N-type impurities independently from the P-type impurities enables the doping of the gate electrodes to be independently optimized, based on the particular design requirements. In another embodiment of the present invention, the activation annealing of the N-type impurities and the P-type impurities are performed in a single annealing step, thereby advantageously saving time associated with separately annealing the implants.

Figure 9:
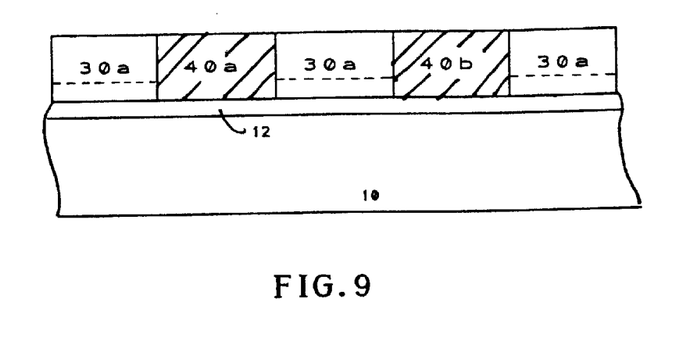
FIG. 9 illustrates a dielectric film and doped N-channel and P-channel gate electrode regions according to an embodiment of the present invention.

The semiconductor device illustrated in FIG. 9 includes N-type doped polysilicon region 40a and P-type doped polysilicon region 40b, separated by film region 30a. Only two doped regions are shown in FIG. 9 in order to not unduly obscure the invention. However, the inventive methodology described above can be used to create a plurality of N-type and P-type doped regions.

Figure 10:
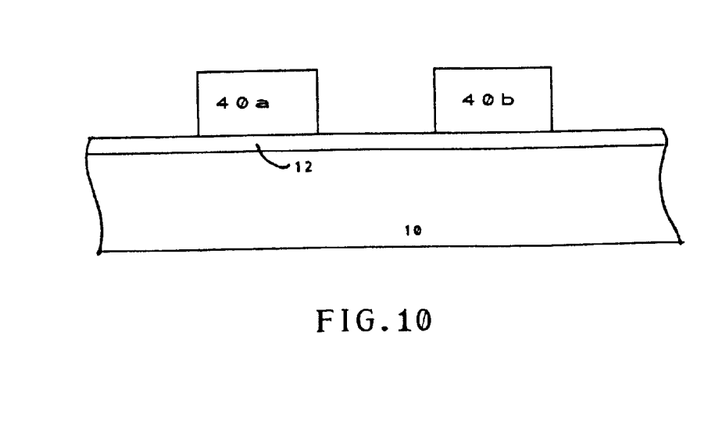
FIG. 10 illustrates the formation of an N-channel gate electrode and a P-channel gate electrode according to an embodiment of the present invention.

Adverting to FIG. 10, film regions 30a are then removed, e.g., by wet etching or dry etching, resulting in N-type doped gate electrode 40a for an N-type transistor and P-type doped gate electrode 40b for a P-type transistor. As discussed previously, film 30 can consist of a stacked structure, e.g., an oxide layer on a nitride layer. In such a situation, the oxide layer is etched followed by etching the nitride layer, resulting in the semiconductor device of FIG. 10.

As discussed previously, film 30 is more easily patterned and etched than polycrystalline silicon which has a large grain size, resulting in gate electrodes 40a and 40b having substantially rectangular profiles. The rectangular profiles enable the subsequently formed transistors to avoid various non-uniformities affecting performance. Gate electrodes 40a and 40b are also uniformly-sized and fully doped enabling the transistors to avoid gate depletion at the gate electrode/gate oxide 12 interface.

Figure 11A:
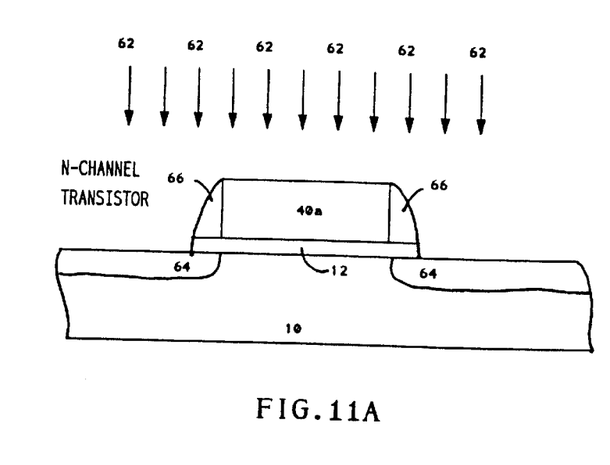
FIGS. 11A and 11B illustrate the formation of sidewall spacers and source/drain regions for an N-channel transistor according to an embodiment of the present invention.
Figure 12:
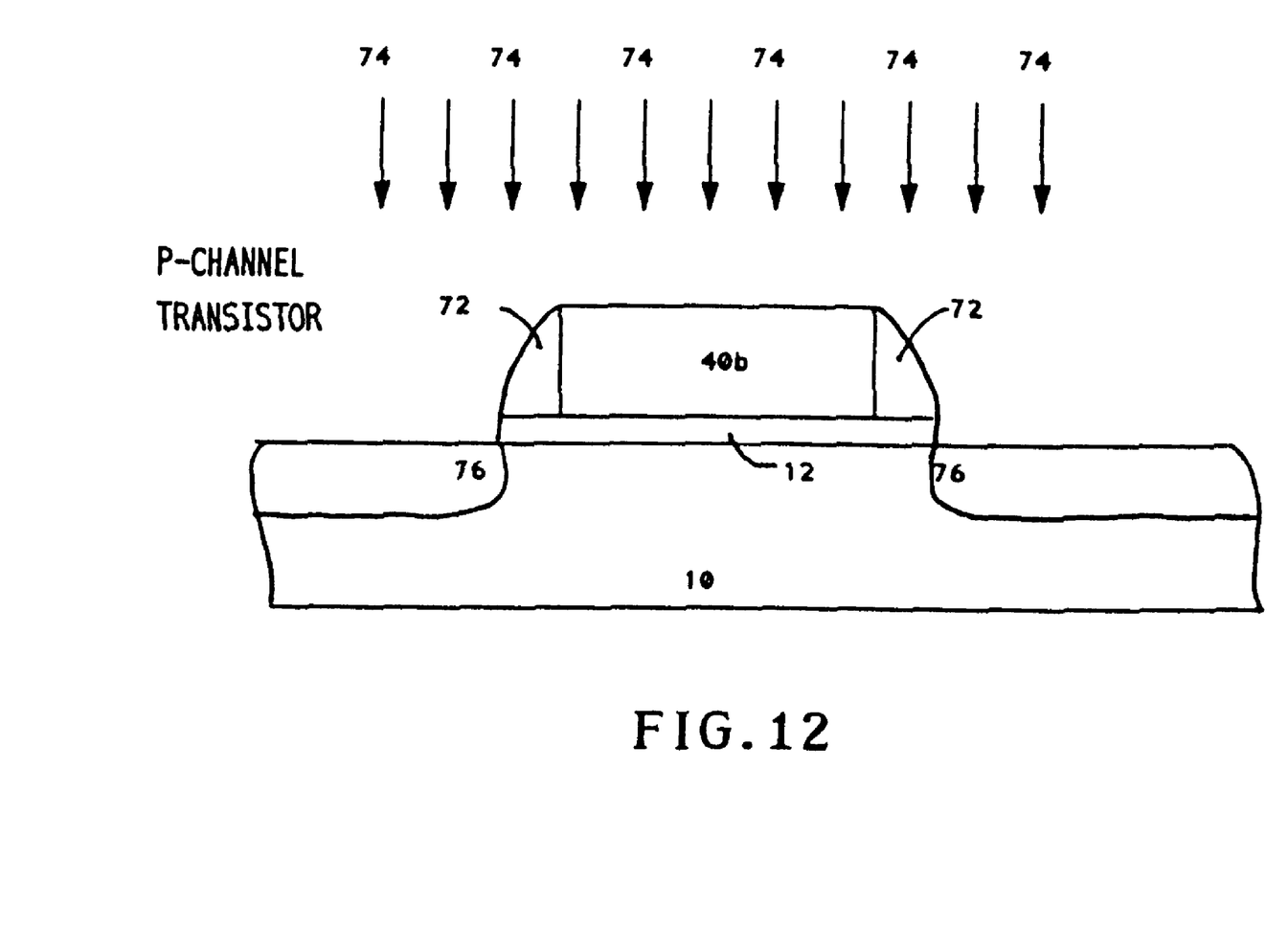
FIG. 12 illustrates the formation of sidewall spacers and source/drain regions for a P-channel transistor according to an embodiment of the present invention.

Subsequently, N-type and P-type impurities are ion implanted to form source/drain regions of the respective N-type and P-type transistors. For example, according to an embodiment of the present invention, N-type impurities are ion implanted, as indicated by arrows 62 in FIG. 11A, to form source/drain extension implants 64. Next, sidewall spacers are formed by depositing a layer of insulating material, e.g., an oxide, a nitride or an oxynitride material. The insulating material is anisotropically etched to form sidewall spacers 66 on the side surfaces of gate electrode 40a, as shown in FIG. 11A, and sidewall spacers 72 on the side surfaces of gate electrode 40b, as shown in FIG. 12. In etching to form sidewall spacers, 66 and 72, gate oxide layer 12 may also be etched, thereby exposing the surface of semiconductor substrate 10 adjacent sidewall spacers 66 and 72.

Subsequently, N-type impurities are ion implanted to form moderately doped source/drain (MDD) or heavily doped source/drain (HDD) implants. Adverting to FIG. 11B, N-type impurities are ion implanted, as indicated by arrows 68, using gate electrode 40a and sidewall spacers 66 as a mask, to form MDD/HDD implants 69.

Figure 11B:
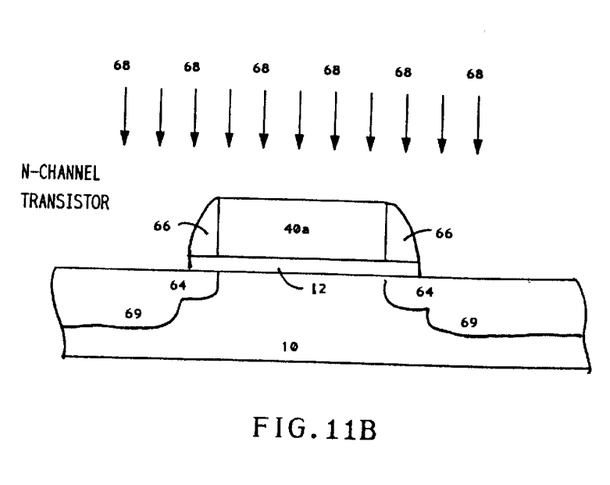

For example, N-type impurities such as arsenic or phosphorous, can be implanted at a dosage of about $5\times10^{13}$ atoms/cm$^2$ to about $1\times10^{16}$ atoms/cm$^2$ and an implantation energy of about 0.2 KeV to about 30 KeV to form MDD/HDD implants 69 of an N-channel MOSFET.

Next, P-type impurities are ion implanted, as indicated by arrows 74 in FIG. 12, using gate electrode 40b and sidewall spacers 72 as a mask, to form source/drain implants 76. For example, P-type impurities, such as boron and $BF_2$, can be implanted at a dosage of about $5\times10^{13}$ atoms/cm$^2$ to about $1\times10^{16}$ atoms/cm$^2$ and an implantation energy of about 0.2 KeV to about 30 KeV to form source/drain implants 76 of a P-channel MOSFET. Alternatively, P-channel transistor can be formed having shallow source/drain extension implants and deeper MDD/HDD implants, in a similar manner to the N-channel transistor illustrated in FIG. 11B.

Activation annealing is then conducted to activate S/D extensions 64 and MDD/HDD implants 69 in the N-channel transistor and source/drain implants 76 in the P-channel transistor. Annealing is typically performed at a temperature of about 900° C. to about 1100° C. to activate the impurity implanted regions, forming the source/drain regions.

In accordance with another embodiment of the invention, a semiconductor device is formed having either N-type transistors or P-type transistors employing the processes described above and illustrated in FIGS. 2–6. However, instead of masking the substrate as described in relation to FIGS. 7 and 8, the gate electrode regions can be doped without masking part of the substrate.

For example, an N-type impurity can be implanted into the device illustrated in FIG. 6 to dope the polysilicon regions to form N-type gate electrodes. Alternatively, a P-type impurity can be implanted into the device illustrated in FIG. 6 to dope the polysilicon regions to form P-type gate electrodes.

The formation of N-channel transistors or P-channel transistors can then proceed as illustrated in FIGS. 11A–B and 12, respectively, based on the particular design requirements. In this manner, the present inventive methodology can also be advantageously employed to form a semiconductor device either N-channel transistors or P-channel transistors.

According to another embodiment of the invention, gate electrode regions 40a and 40b illustrated in FIG. 7 are not doped with impurities before film 30a is etched. In other words, the device illustrated in FIG. 6 is etched to remove film 30a, resulting in gate electrodes 40a and 40b, as illustrated in FIG. 10. In this manner, problems associated with different etch rates between P-type and N-type doped materials is eliminate, thereby enabling the gate electrodes to be formed having gate electrodes with rectangular profiles. The gate electrodes 40a and 40b are then doped in a manner similar to the ion implantation steps illustrated in FIGS. 7 and 8, followed by the formation of the source/drain regions.

Thus, in accordance with the present invention, problems associated with forming fully-doped, rectangular gate electrodes are eliminated or substantially reduced by employing a film to form gate electrode regions. As a result, subsequently formed source/drain regions can achieve a desirably shallow junction depth ($X_J$), e.g., less than about 800 Å for a gate electrode having a width of about 0.25 microns. Additionally, subsequently formed gate electrodes can achieve a substantially rectangular profile, advantageously enabling subsequently formed implants to achieve the targeted channel length.

Another advantage of the present invention is that gate electrode doping is de-coupled from subsequent source/drain formation, enabling the subsequently formed gate electrode to be fully doped and avoid gate depletion, while achieving desirably shallow $X_j$. Additionally, separately annealing N-type implanted impurities and P-type implanted impurities advantageously allows independent optimization of N-type and P-type gate electrodes. The present invention also provides semiconductor processing enabling the formation of N-channel and P-channel transistors in an efficient manner.

In the previous descriptions, numerous specific details are set forth, such as specific materials, structures, chemicals, processes, etc., in order to provide a thorough understanding of the present invention. However, the present invention can be practiced without resorting to the details specifically set forth. In other instances, well known processing structures have not been described in detail, in order not to unnecessarily obscure the present invention.

The dielectric and conductive layers utilized in manufacturing a semiconductor device in accordance with the present invention can be deposited by conventional deposition techniques. For example, metallization techniques such as various types of chemical vapor deposition (CVD) processes, including low pressure chemical vapor deposition (LPCVD) and enhanced chemical vapor deposition (ECVD) can be employed.

The present invention enjoys applicability in the manufacturing of semiconductor devices and particularly in semiconductor devices comprising design features of 0.25 microns and under, with increased transistor and circuit speeds and improved reliability. The present invention is applicable to the formation of any of various types of semiconductor devices and, hence, details have not been set forth herein in order to avoid obscuring the trust of the present invention. In practicing the present invention, conventional photolithographic and etching techniques are employed and, hence, the details of such techniques have not been set forth herein in detail.

Only the preferred embodiments of the invention and but a few examples of its versatility are shown and described in the present disclosure. It is to be understood that the invention is capable of use in various other combinations and environments and is capable of changes or modifications within the scope of the inventive concept as expressed herein.

What is claimed is:

1. A method of manufacturing a semiconductor device, which method comprises:
   forming a first dielectric layer, comprising a first dielectric material, on an upper surface of a semiconductor substrate;
   forming a second dielectric layer, comprising a second dielectric material different from the first dielectric material, directly on the first dielectric layer;
   patterning and etching the second dielectric layer to form regions having a rectangular profile on the first dielectric layer, separated by open regions;
   depositing a layer of gate electrode material on the semiconductor substrate filling the open regions; and
   planarizing the layer of gate electrode material leaving gate electrode material in the open regions having an upper surface and side surfaces, wherein the side surfaces are substantially parallel to each other and substantially perpendicular to the upper surface of the semiconductor substrate.

2. The method of claim 1, comprising:
   implanting impurities into the gate electrode material filling the openings.

3. The method of claim 2, comprising:
   activation annealing at a temperature of about 900° C. to about 1075° C. to activate the impurities forming a gate electrode.

4. The method of claim 3, comprising:
   removing the second dielectric layer by etching.

5. The method of claim 4, comprising:
   ion implanting impurities, using the gate electrode as a mask, to form source/drain extension implants in the semiconductor substrate;
   depositing an insulating layer on the semiconductor substrate; and
   etching the insulating layer to form insulating sidewall spacers on the side surfaces of the gate electrode.

6. The method of claim 5, comprising:
   ion implanting impurities, using the gate electrode and sidewall spacers as a mask, to form moderately or heavily doped implants in the semiconductor substrate; and
   activation annealing the implanted impurities to form source/drain regions in the semiconductor substrate.

7. The method of claim 1, wherein the second dielectric layer comprises a stacked structure with a first dielectric sub-layer formed on the first dielectric layer and a second dielectric sub-layer formed on the first dielectric sub-layer.

8. The method of claim 7, wherein the first dielectric layer comprises a silicon oxide and the first dielectric sub-layer comprises a silicon nitride.

9. The method of claim 1, wherein the planarizing step comprises chemical-mechanical polishing.

10. A method of manufacturing a CMOS semiconductor device having an N-channel transistor region and a P-channel transistor region, which method comprises:
    forming a first dielectric layer, comprising a first dielectric material, on an upper surface of a semiconductor substrate;
    forming a second dielectric layer, comprising a second dielectric material different from the first dielectric material, directly on the first dielectric layer;
    patterning and etching the second dielectric layer to form regions having a rectangular profile on the first dielectric layer, separated by open regions;
    depositing a layer comprising a gate electrode material on the semiconductor substrate filling the open regions; and
    planarizing the layer comprising a gate electrode material leaving gate electrode material in the openings in a N-channel transistor and P-channel transistor regions having an upper surface and side surfaces, wherein the side surfaces are substantially parallel to each other and substantially perpendicular to the upper surface of the semiconductor substrate.

11. The method of claim 10, comprising:
    forming a mask over the P-channel transistor region;
    implanting N-type impurities to dope the gate electrode material in the N-channel transistor region;
    removing the P-channel transistor region mask; and
    activation annealing to activate the N-type impurities forming a first gate electrode.

12. The method of claim 11, comprising:
    forming a mask over the N-channel transistor region;

implanting P-type impurities to dope the gate electrode material in the P-channel transistor region;

removing the N-channel transistor region mask; and activation annealing to activate the P-type impurities forming a second gate electrode.

13. The method of claim 12, comprising removing the second dielectric layer by etching;

implanting N-type impurities, using the first gate electrode as a mask, to form N-type source/drain extension implants of the N-channel transistor;

depositing an insulating layer on the semiconductor substrate;

etching the insulating layer to form insulating sidewall spacers on the side surfaces of the first and second gate electrodes;

implanting N-type impurities, using the first gate electrode and insulating sidewall spacers as a mask, to form N-type moderately doped or heavily doped implants of the N-channel transistor;

implanting P-type impurities, using the second gate electrode and insulating sidewall spacers as a mask, to form P-type source/drain implants of the P-channel transistor; and activation annealing to form source/drain regions of the N-channel transistor and the P-channel transistor.

14. The method of claim 10, wherein the gate electrode material comprises polycrystalline silicon and the second dielectric layer comprises a silicon nitride.

15. The method of claim 10, wherein the second dielectric layer comprises a stacked structure with a first dielectric sub-layer formed on the first dielectric layer and a second dielectric sub-layer formed on the first dielectric sub-layer.

16. The method of claim 10, comprising:

removing the second dielectric layer;

implanting impurities to dope the first gate electrode; and implanting impurities to dope the second gate electrode.

17. The method of claim 16, comprising:

implanting impurities to form source/drain implants of the N-channel transistor;

implanting impurities to form source/drain implants of the P-channel transistor; and activation annealing to form source/drain regions of the N-channel transistor and the P-channel transistor.

18. A method of manufacturing a semiconductor device, the method comprising sequentially:

forming a first dielectric layer on an upper surface of a semiconductor substrate;

forming a film on the first dielectric layer;

patterning the film to form regions, separated by openings, having a rectangular profile on the first dielectric layer;

depositing a layer of gate electrode material filling the openings with gate electrode material;

planarizing the layer of gate electrode material leaving gate electrode material in the openings having an upper surface and substantially parallel side surfaces substantially perpendicular to the upper surface of the semiconductor substrate;

ion implanting impurities into the gate electrode material filling the openings;

removing the film; and ion implanting to form source/drain regions.

19. The method of claim 18, wherein the first dielectric layer comprises a dielectric material and the film comprises a second dielectric different from the first dielectric material.

20. The method of claim 19, wherein the first dielectric layer comprises silicon oxide and the second dielectric material comprises silicon nitride.

* * * * *